(12) United States Patent
Meiser et al.

(10) Patent No.: US 10,002,959 B2
(45) Date of Patent: Jun. 19, 2018

(54) SEMICONDUCTOR DEVICE COMPRISING A TEMPERATURE SENSOR, TEMPERATURE SENSOR AND METHOD OF MANUFACTURING A SEMICONDUCTOR DEVICE COMPRISING A TEMPERATURE SENSOR

(71) Applicant: Infineon Technologies AG, Neubiberg (DE)

(72) Inventors: Andreas Meiser, Sauerlach (DE); Till Schloesser, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/429,282

(22) Filed: Feb. 10, 2017

(65) Prior Publication Data

US 2017/0236931 A1    Aug. 17, 2017

(30) Foreign Application Priority Data

Feb. 12, 2016  (DE) .................... 10 2016 102 493

(51) Int. Cl.
*H01L 29/78* (2006.01)
*H01L 29/10* (2006.01)
(Continued)

(52) U.S. Cl.
CPC .......... *H01L 29/7804* (2013.01); *H01L 23/34* (2013.01); *H01L 23/5283* (2013.01); *H01L 29/1095* (2013.01); *H01L 29/4236* (2013.01); *H01L 29/66712* (2013.01); *H01L 29/7813* (2013.01)

(58) Field of Classification Search
CPC . H01L 29/7804; H01L 23/34; H01L 23/5283; H01L 29/1095; H01L 29/4236; H01L 29/66712; H01L 29/7813; H01L 41/1132; H01L 41/125; H01L 2924/13072;
(Continued)

(56) References Cited

U.S. PATENT DOCUMENTS

2008/0135872 A1*  6/2008  Chen .................. H01L 27/0629
                                                    257/173
2012/0104612 A1*  5/2012  Kimura ................ H01L 23/051
                                                    257/751

(Continued)

*Primary Examiner* — Shahed Ahmed
(74) *Attorney, Agent, or Firm* — Volpe and Koenig, P.C.

(57) ABSTRACT

A semiconductor device includes a transistor in a semiconductor substrate having a first main surface. The transistor includes a source region, a source contact, the source contact including a first and second source contact portion, and a gate electrode in a gate trench in the first main surface adjacent to a body region. The body region and a drift zone are disposed along a first direction parallel to the first main surface between the source region and a drain region. The second source contact portion is disposed at a second main surface of the semiconductor substrate. The first source contact portion includes a source conductive material in direct contact with the source region, the first source contact portion further including a portion of the semiconductor substrate between the source conductive material and the second source contact portion. The semiconductor device further includes a temperature sensor in the semiconductor substrate.

18 Claims, 15 Drawing Sheets

(51) Int. Cl.
*H01L 29/423* (2006.01)
*H01L 23/528* (2006.01)
*H01L 29/66* (2006.01)
*H01L 23/34* (2006.01)

(58) Field of Classification Search
CPC ........... H01L 29/66325; H01L 29/7393; H01L 29/4175
USPC ........ 257/226, 414, 423, 470; 438/133, 170, 438/202, 309
See application file for complete search history.

(56) References Cited

U.S. PATENT DOCUMENTS

| | | | |
|---|---|---|---|
| 2013/0020587 A1* | 1/2013 | Hino | H01L 29/1095 257/77 |
| 2014/0334522 A1 | 11/2014 | Meiser et al. | |
| 2016/0056144 A1* | 2/2016 | Yao | H01L 29/66348 438/54 |
| 2016/0111348 A1* | 4/2016 | Yao | H01L 29/66348 257/49 |
| 2016/0181496 A1* | 6/2016 | Kegler | H01L 35/04 257/53 |

\* cited by examiner

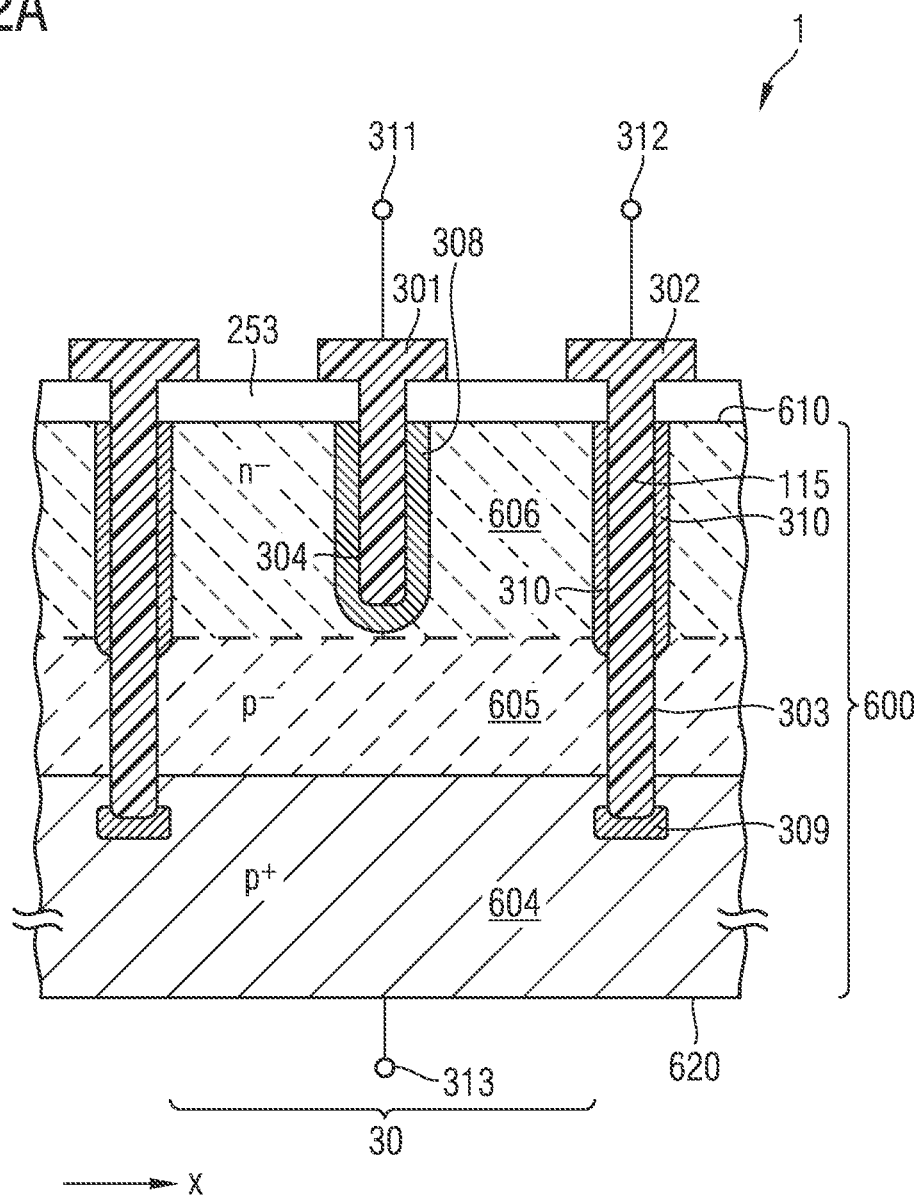

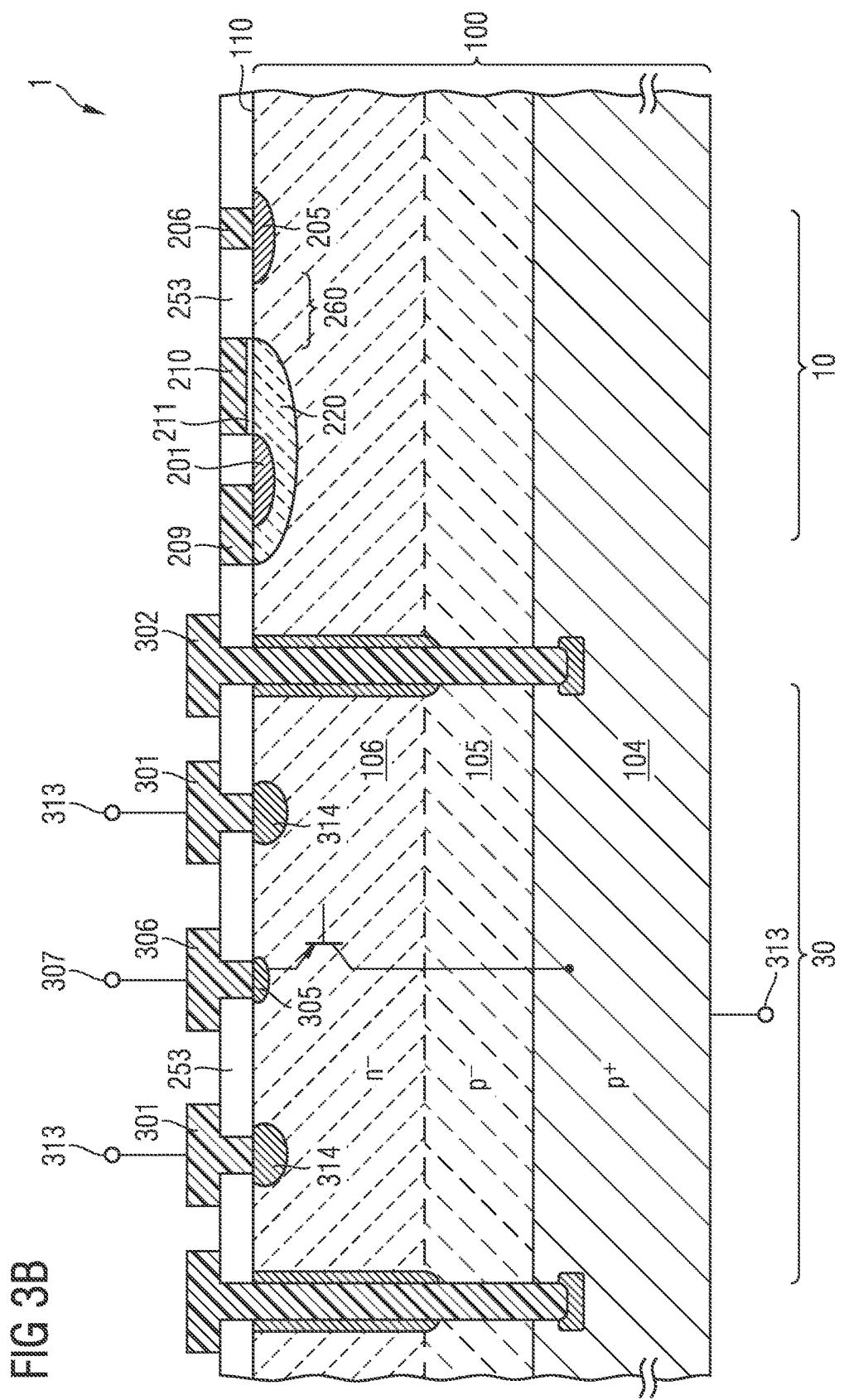

SEMICONDUCTOR DEVICE COMPRISING A TEMPERATURE SENSOR, TEMPERATURE SENSOR AND METHOD OF MANUFACTURING A SEMICONDUCTOR DEVICE COMPRISING A TEMPERATURE SENSOR

FIELD

The present disclosure relates generally to a semiconductor device and to methods for manufacturing the same, and, more particularly, to a semiconductor device having a temperature sensor integrated into a power transistor.

BACKGROUND

Power transistors commonly employed in automotive and industrial electronics should have a low on-state resistance ($R_{on} \cdot A$), while securing a high voltage blocking capability. For example, a metal oxide semiconductor (MOS) power transistor should be capable, depending upon application requirements, to block to drain to source voltages $V_{ds}$ of some tens to some hundreds or thousands volts. MOS power transistors typically conduct very large currents which may be up to some hundreds of amperes at typical gate-source voltages of about 2 to 20 V.

A concept for transistors having a further improved $R_{on} \cdot A$ characteristic refers to lateral power trench metal oxide semiconductor field effect transistor (MOSFET). Lateral power trench MOSFETs utilize more bulk silicon for reducing $R_{on}$ so that $R_{on}$ is comparable to that of a vertical trench MOSFET.

Monitoring the temperature inside the transistor cell array of a power transistor has become increasingly important. For example, it may be determined whether the temperature inside the power transistor exceeds a certain threshold value so that the transistor may be switched off when the threshold temperature is exceeded. Further, it may be desirable to measure the temperature inside the transistor cell array. Therefore, it may be desirable to integrate a temperature sensor into a power transistor.

SUMMARY

According to an embodiment, a semiconductor device includes a transistor in a semiconductor substrate having a first main surface. The transistor includes a source region, a source contact electrically connected to the source region, the source contact comprising a first source contact portion and a second source contact portion. The transistor further includes a gate electrode in a gate trench in the first main surface adjacent to a body region. The gate electrode is configured to control a conductivity of a channel in the body region. The body region and a drift zone are disposed along a first direction parallel to the first main surface between the source region and a drain region. The second source contact portion is disposed at a second main surface of the semiconductor substrate. The first source contact portion includes a source conductive material in direct contact with the source region. The first source contact portion further includes a portion of the semiconductor substrate between the source conductive material and the second source contact portion. The semiconductor device further includes a temperature sensor in the semiconductor substrate.

According to a further embodiment, a semiconductor device includes a temperature sensor in a semiconductor body comprising a first region of a first conductivity type and a first portion of a second conductivity type, the first region being disposed over the first portion. The temperature sensor includes a first contact in contact with the first region, and a second contact in contact with the first portion. The second contact is disposed in a second sensor contact groove in a first main surface of the semiconductor body and extends to the first portion.

According to an embodiment, a method for manufacturing a semiconductor device comprising a temperature sensor in a semiconductor body comprising a first region of a first conductivity type and a first portion of a second conductivity type, the first region being disposed over the first portion, includes forming a first contact in contact with the first region and forming a second contact in contact with the first portion. The second contact is disposed in a second sensor contact groove in a first main surface and extends to the first portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2A shows elements of a temperature sensor according to an embodiment;

FIGS. 3A and 3B show semiconductor devices according to further embodiments;

DETAILED DESCRIPTION

Figure 1A:
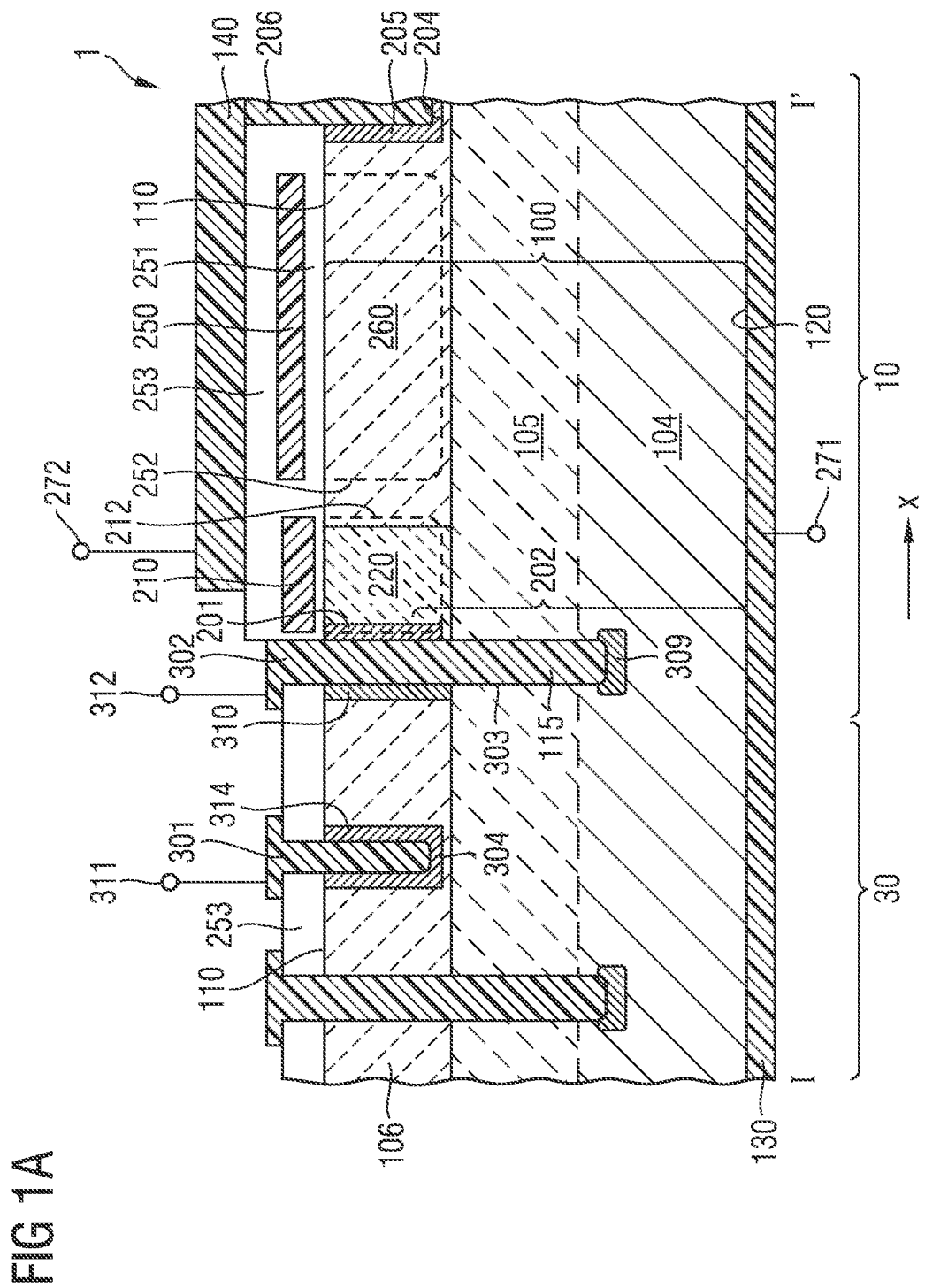
FIG. 1A shows a cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

Figure 4A:
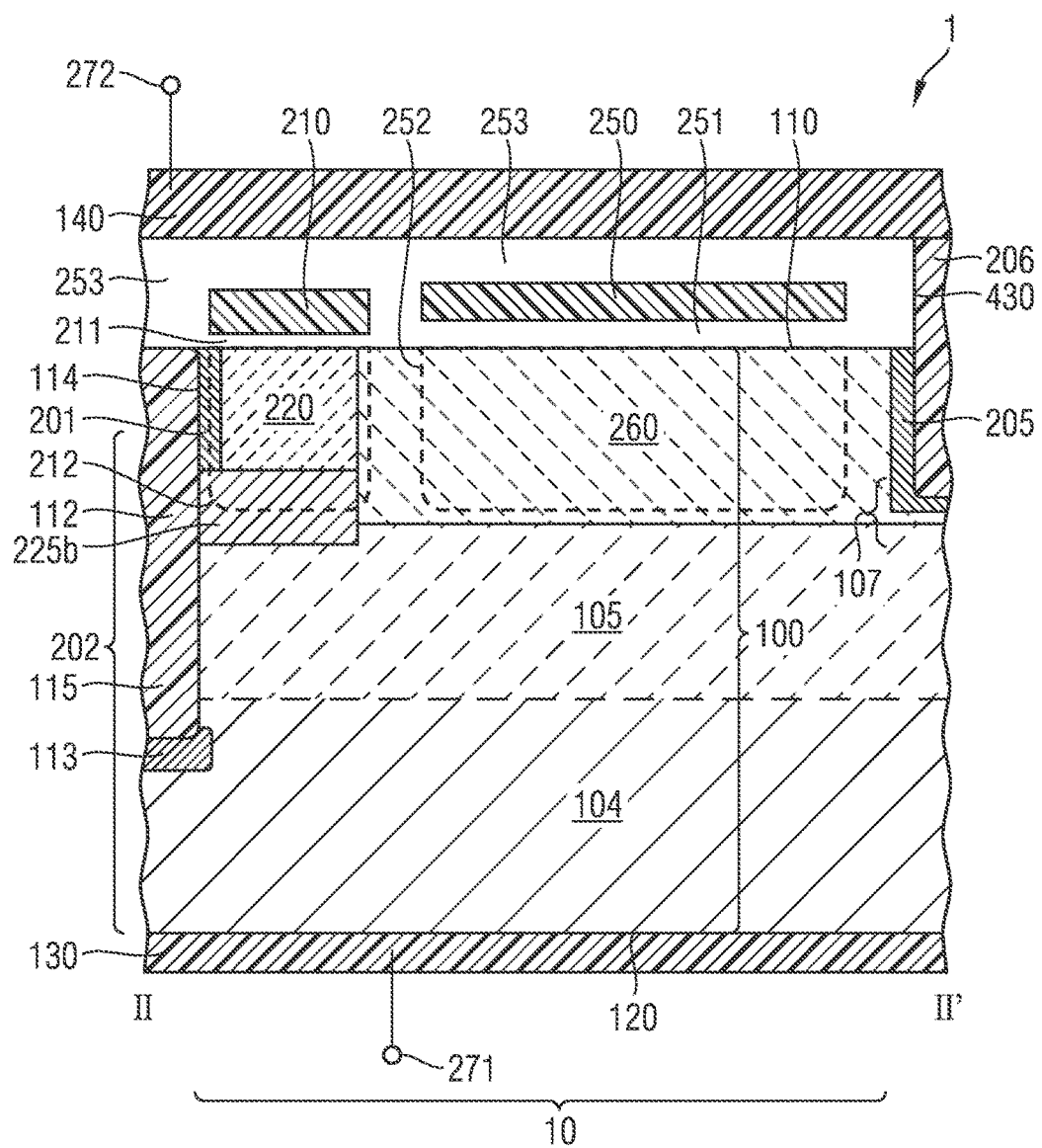
FIGS. 4A to 4D shows various views of a semiconductor device according to an embodiment.
Figure 4B:
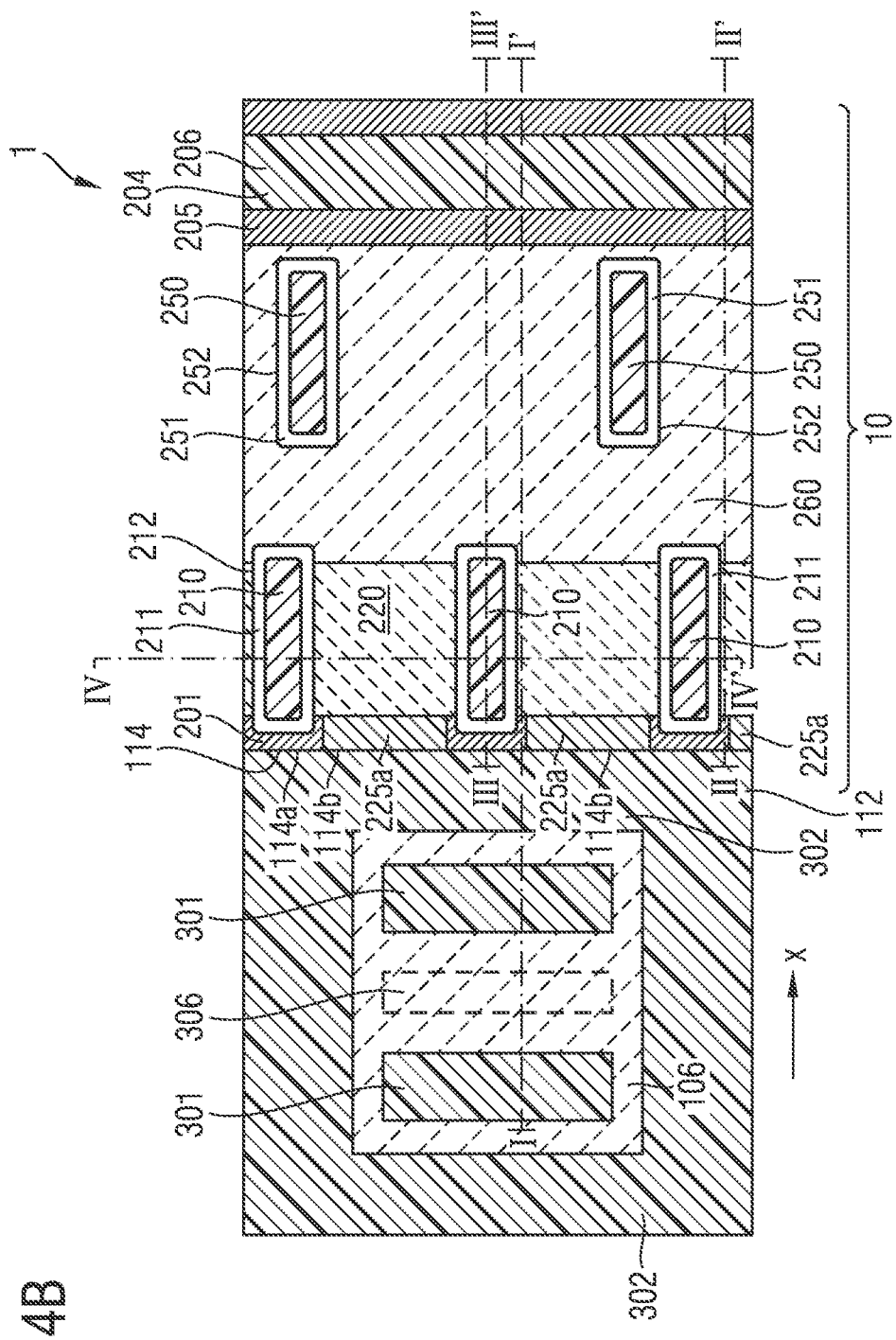

FIG. 1A shows a cross-sectional view of a semiconductor device according to an embodiment. The cross-sectional view of FIG. 1A is taken between I and I', as is also illustrated in FIG. 4B. The semiconductor device 1 shown in FIG. 1A comprises a transistor 10 in a semiconductor substrate 100 having a first main surface 110. The transistor 10 comprises a source region 201 and a source contact electrically connected to the source region 201. The source contact comprises a first source contact portion 202 and a second source contact portion 130. The semiconductor device further comprises a gate electrode 210 in gate trench 212 which is indicated by broken lines in FIG. 1A and disposed before or behind the depicted plane of the drawing. The gate trench 212 is formed in the first main surface 110 adjacent to a body region 220. The gate electrode 210 is configured to control a conductivity of a channel in the body region 220. The body region and a drift zone 260 are disposed along a first direction, e.g. the x-direction, parallel to the first main surface 110 between the source region 201 and a drain region 205. The second source contact portion 130 is disposed at a second main surface 120 of the semiconductor substrate 100. The first source contact portion 202 comprises a source conductive material 115 which is in direct contact with the source region 201. The first source contact portion 202 further comprises a portion of the semiconductor substrate 100 between the source conductive material 115 and the second source contact portion 130. The semiconductor device 1 further comprises a temperature sensor 30 in the semiconductor substrate 100.

As will be explained in more detail with reference to FIGS. 4A to 4D, the transistor implements a lateral transistor which may be contacted from two opposing main surfaces 110, 120 of the semiconductor substrate 100. According to the embodiment shown in FIG. 1A, the source region 201 is electrically connected via the source contact to a source terminal 271. For example, the source terminal 271 may be connected to Ground. For example, a source conductive material 115 may be disposed in a source contact groove 112 in the first main surface 110. Further, the drain region 205 is electrically connected via the drain contact 206 to a drain contact layer 140 on a side of a first main surface 110 of the semiconductor substrate. The source region 201 and the drain region 205 may be disposed adjacent to the first main surface 110 of the semiconductor substrate. The body region 220 and the drift zone 260 are disposed adjacent to the first main surface 110 of the semiconductor substrate, so that a current flow that is controlled by the gate electrode 210 mainly is accomplished in a horizontal direction. At the same time, the source region is electrically connected to a second source contact portion 130 which is disposed adjacent to the second main surface 120 of the semiconductor substrate. According to the embodiment of FIG. 1A, a portion of the gate electrode 210 is disposed over the first main surface 110 and is arranged to control a conductivity of a channel region formed adjacent to the first main surface 110. The gate electrode 210 is insulated from the body region 220 by means of a gate dielectric layer 211.

According to an embodiment, the semiconductor substrate 100 comprises a first portion 104 of a second conductivity type, a second portion 105 of the second conductivity type and a first region 106 of a first conductivity type. The first portion 104 has a larger distance to the first main surface 110 than the second portion 105. The first portion 104 has a larger doping concentration than the second portion 105. The first portion 104 is a component of the first source contact portion 202. The source contact groove 112 may extend to the first portion 104. The source conductive material 115 filling the source contact groove 112 electrically contacts the first portion 104 or the second portion 105. Accordingly, the first source contact portion 202 of the source contact comprises the source conductive material 115 which is in direct contact with the source region. Further, the source contact comprises part of the first portion 104 and, optionally, of the second portion 105. According to an embodiment, the doping concentration may gradually increase from the second portion to the first portion.

The temperature sensor 30 comprises a pn junction, e.g. between the second portion 105 and the first region 106. The temperature sensor 30 further comprises a first contact 301 in contact with the first region 106 and a second contact 302 in contact with the first portion 104. According to the embodiment shown in FIG. 1A, components of the temperature sensor 30, in particular, the second contact is implemented by components of the transistor, e.g. the source contact. According to further embodiments, the components of the transistor 10 may be implemented separately from the components of the temperature sensor 30. In the embodiment shown in FIG. 1A, the source region and the drain region may be of the first conductivity type, and the body region 220 is of the second conductivity type. The drift zone 260 may be of the first conductivity type. For example, the first conductivity type may be n-type, and the second conductivity type may be p-type.

The first contact 301 may be disposed in a first sensor contact groove 304 that is formed in the first main surface 110. The second contact 302 is disposed in a second sensor contact groove 112, 303 in the first main surface 110 and extends to the first portion 104. For example, the source contact groove 112 and the second sensor contact groove 303 may be implemented by one single groove as is also illustrated in FIG. 1A. Alternatively, the source contact groove 112 and the sensor contact groove 303 may be separate from each other and may extend to the same depth. For example, the second sensor contact groove 303 may not extend to the second main surface 120 of the semiconductor substrate 100. Likewise, the source contact groove 112 may not extend to the second main surface 120 of the semiconductor substrate.

A doped sidewall region 310 may be disposed between the second sensor contact groove 303 and the first region 106 of the semiconductor substrate so as to provide an electrical insulation. The doped sidewall region 310 may be doped with the second conductivity type. A second doped portion 309 may be disposed at a bottom side of the source contact groove 112 and the second sensor contact groove 303 in order to reduce a contact resistance between the conductive material 115 inside the source contact groove 112 or the second sensor contact groove 303 and the adjacent semiconductor material.

The specific functionality of the transistor and of the temperature sensor will be explained later.

Figure 1B:
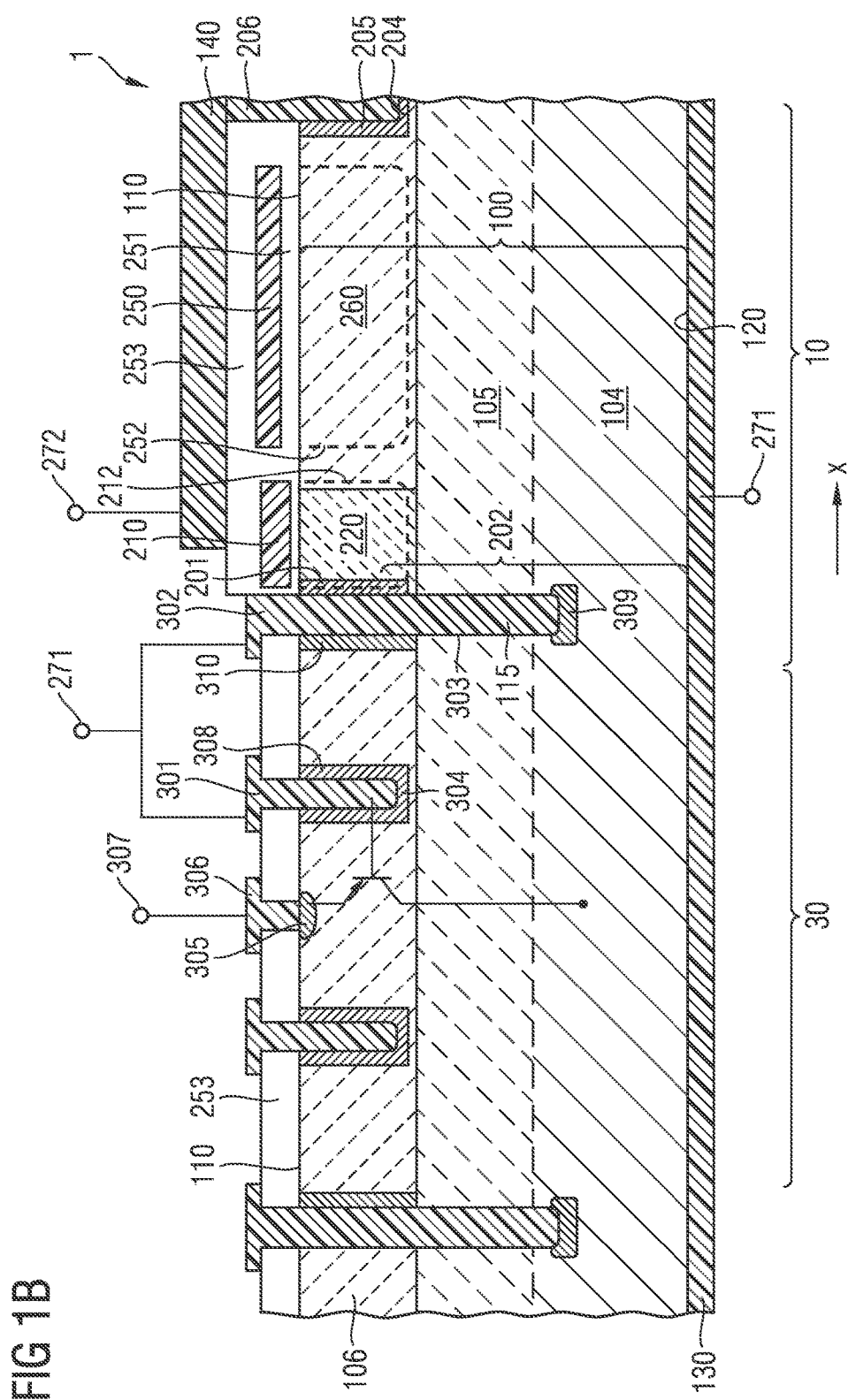
FIG. 1B shows a cross-sectional view of a semiconductor device according to a further embodiment.

FIG. 1B shows a cross-sectional view of a semiconductor device according a further embodiment. The semiconductor device 1 of FIG. 1B comprises basically the same components as the semiconductor device 1 shown in FIG. 1A. Differing from the embodiment of FIG. 1A, the temperature sensor may be implemented as a bipolar transistor in which a basis terminal and a collector terminal are electrically connected. The sensor element 30 further comprises an emitter region 305 of the second conductivity type in contact with the first region 106. The semiconductor device 1 may further comprise an emitter contact 306 in contact with the emitter region 305. The emitter contact 306 may be connected to an emitter terminal 307. The first contact 301 may implement the basis contact and the second contact 302 may implement the collector contact. The first contact 301 and the second contact 302 may be connected to a common terminal. For example, the second source contact portion 130, the first contact 301 and the second contact 302 may be connected to a common terminal 271, e.g. the ground terminal. The emitter contact 306 is disposed adjacent to the first main surface 110 and may not be formed so as to extend into the semiconductor substrate. The emitter region 305 may be formed as a doped portion adjacent to the first main surface 110. For example, a doped portion 308 of the first conductivity type may be disposed adjacent to the sidewalls and the bottom side of the first source contact groove 304 to provide a contact between the conductive material forming the first contact 301 and the adjacent semiconductor material.

The concept illustrated in FIGS. 1A and 1B may also be applied to a so-called "drain-down" transistor, comprising a drain contact that electrically connects the drain region 205 with a drain terminal 294 that is disposed adjacent to a second main surface 120 of the semiconductor substrate 100. According to an embodiment, the drain terminal 294 may be connected to Ground.

Figure 1C:
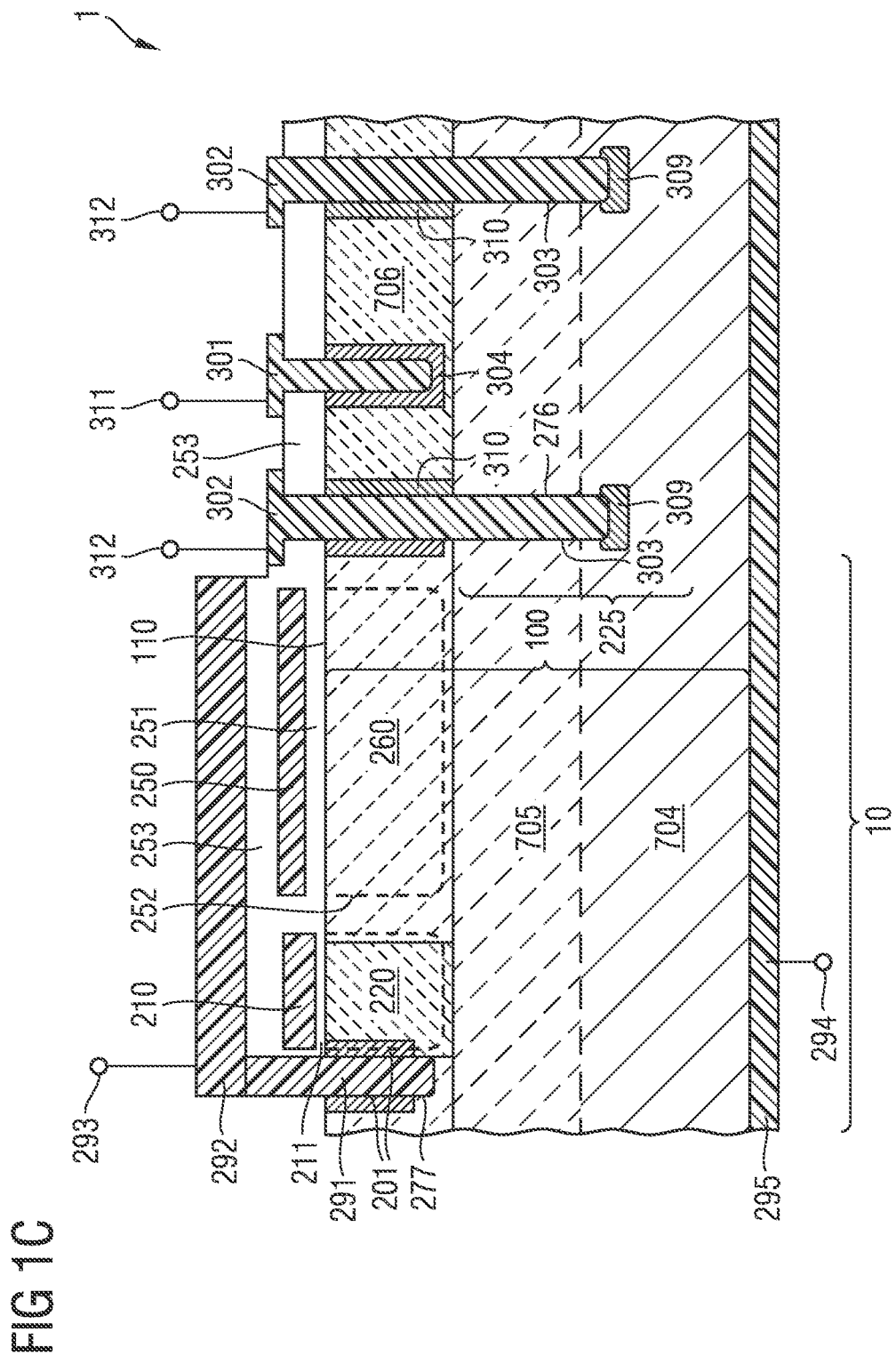
FIG. 1C shows a semiconductor device according to a further embodiment.
Figure 1D:
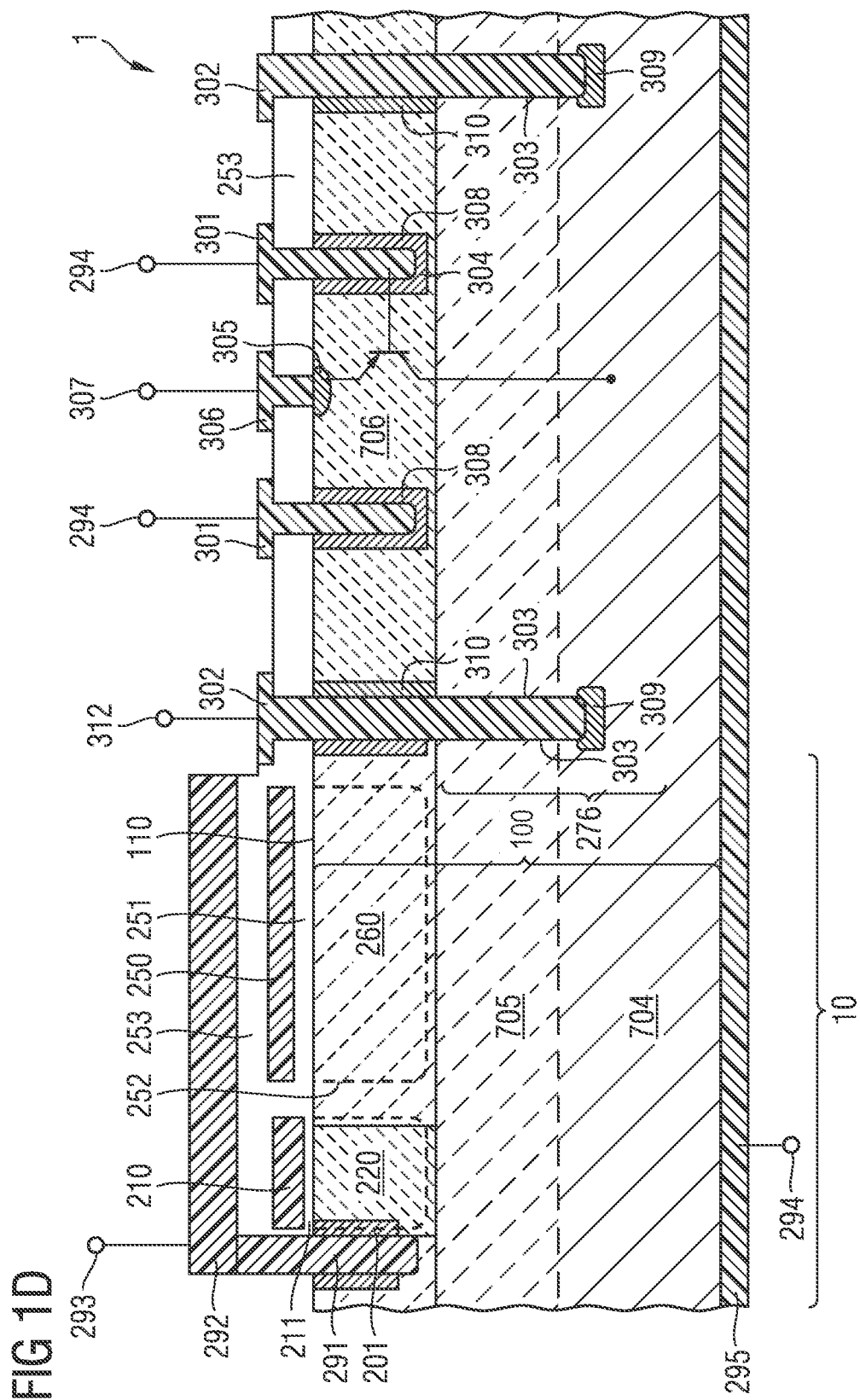
FIG. 1D shows a semiconductor device according to still a further embodiment.

FIGS. 1C and 1D shows cross-sectional views of semiconductor devices according to these embodiments. As is shown in FIG. 1C, the semiconductor device 1 comprises a transistor 10 in a semiconductor substrate 100 having a first main surface 110. The transistor 10 comprises similar components that have been discussed with reference to FIG. 1A. The drain contact is implemented in a manner different from the embodiment of FIG. 1A.

The transistor 10 comprises a drain region 205 and a drain contact electrically connected to the drain region 205. The drain contact comprises a first drain contact portion 275 and a second drain contact portion 295. The semiconductor device further comprises a gate electrode 210 and a gate trench 212 in the first main surface 110 adjacent to a body region 220. The gate electrode 210 is configured to control a conductivity of a channel in the body region 220. The body region 220 and a drift zone 260 are disposed along a first direction parallel to the first main surface 110 between a source region 201 and the drain region 205. The second drain contact portion 295 is disposed at a second main surface 120 of the semiconductor substrate 100. The first drain contact portion 275 comprises a drain conductive material 115 in direct contact with the drain region 205. The first drain contact portion 275 further comprises a portion 704 of the semiconductor substrate 100 between the drain conductive material 115 and the second drain contact portion 295. The semiconductor device 1 further comprises a temperature sensor 30 in the semiconductor substrate 100.

According to the embodiment shown in FIG. 1C, the drain conductive material 115 may be disposed in a drain contact groove 276 in the first main surface 110. The drain contact groove 276 may extend to the first portion 704 of the semiconductor substrate 100.

As is shown in FIG. 1C, the semiconductor substrate 100 comprises a first portion 704 of a second conductivity type, a second portion 705 of the second conductivity type and a first region 706 of a first conductivity type. The first portion 704 has a larger distance to the first main surface 110 than the second portion 705. The first portion 704 has a larger doping concentration than the second portion 705. The first portion 704 is a component of the first drain contact portion 275.

The temperature sensor 30 comprises a pn junction, e.g. between the second portion 705 and the first region 706. The temperature sensor 30 further comprises a first contact 301 in contact with the first region 706, and a second contact 302 in contact with the first portion 704. The first contact 301 may be disposed in a first sensor contact groove 304 in the first main surface 110. The second contact 302 may be disposed in a second sensor contact groove 303 in the first main surface 110 and may extend to the first portion 704. The drain contact groove 276 and the second sensor contact groove 303 may extend to the same depth. For example, the second sensor contact groove 303 may not extend to the second main surface 120 of the semiconductor substrate. In a similar manner as has been discussed with reference to FIGS. 1A and 1B, the second sensor contact groove 303 may be merged with the drain contact groove 276. Alternatively, these grooves may be separate from each other and may extend to the same depth.

According to the embodiment shown in FIG. 1C, the source region and the drain region are of the second conductivity type, and the body region is of the first conductivity type. The drift zone 260 is of the second conductivity type. For example, the second conductivity type may be n-type and the first conductivity type may be p-type.

FIG. 1D shows a cross-sectional view of a semiconductor device according to a further embodiment. Differing from the embodiment shown in FIG. 1C, the temperature sensor further comprises an emitter region 305 of the second conductivity type in contact with the first region 706. The semiconductor device may further comprise an emitter contact 306 in contact with the emitter region 305. The emitter contact 306 may be electrically connected to an emitter terminal 307. Further, example, the first sensor contact 301 (basis) and the second sensor contact 302 (collector) may be connected to a common terminal. For example, the common terminal may be the drain terminal 294. According to an embodiment, the common terminal and the drain terminal 294 may be connected to Ground.

Figure 1E:
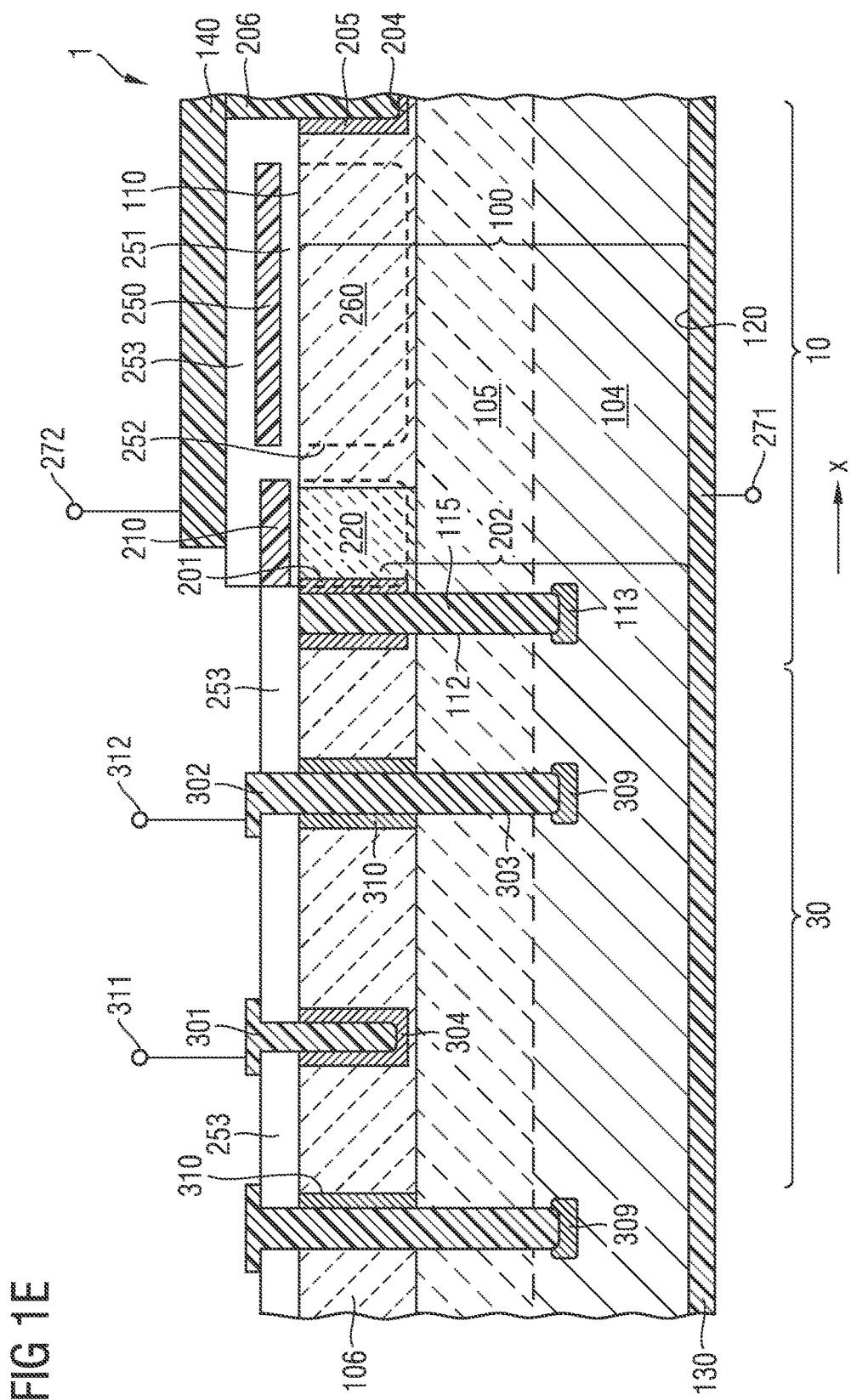
FIG. 1E shows a shows a cross-sectional view of a semiconductor device according to a further embodiment.

FIG. 1E shows a semiconductor device according to an embodiment in which the second sensor contact groove 303 is formed separately from the source contact groove 112. The further components of the semiconductor device are similar or identical with the respective components explained with reference to FIG. 1A. The source contact groove 112 extends to the same depth as the second sensor contact groove 303. In particular, these grooves may be formed by common or joint processing methods. A doped portion of the second conductivity type 113 may be disposed at a bottom side of the source contact groove 112. Further, a doped portion 309 of the second conductivity type may be disposed adjacent to a bottom side of the second sensor groove 303. The source contact groove 112 may be disconnected from a conductive material at a first main surface 110 of the semiconductor device. The second sensor contact 302 may extend to a metallization layer at the first main surface 110 of the semiconductor device.

As is to be readily appreciated, any of the semiconductor devices described herein may comprise a second sensor contact groove 303 which is separate from the source contact groove 112 or the drain contact groove 276.

According to the embodiment of FIGS. 1A and 1B, the first sensor contact trench 304 may be formed simultaneously or by common processing steps with the drain contact trench 204. According to the embodiment of FIGS. 1C and 1D, the first sensor contact trench 304 may be formed by common or joint processing steps as the source contact trench 277. Further, in the embodiment of FIGS. 1A and 1B, the second sensor contact trench 303 may be merged with the source contact trench 112, and in the embodiment of FIGS. 1C and 1D, the second sensor contact trench 303 may be merged with the drain contact trench 276. When the second sensor contact trench 303 is not merged with the source contact trench 112 or the drain contact trench 276, it may be formed simultaneously with the source contact trench 212 or the drain contact trench 276. Accordingly, each of the first and second sensor contact trenches 303, 304 has its counterpart in the transistor 10, e.g. the source contact trench 112 and the drain contact trench 204 or the source contact trench 277 and the drain contact trench 276. As a result, the temperature sensor 30 may be implemented in an easy manner and methods for forming components of the transistor may be used for manufacturing components of the temperature sensor 30. As a result, the manufacturing process may be simplified.

According to embodiments, the temperature sensor comprises portions or regions of a first conductivity type and portions or regions of a second conductivity type to form a pn junction or a diode. The pn junction or diode may be driven in forward direction. In this case, the forward voltage may be determined, while impressing a constant forward current. The forward voltage basically varies linearly with temperature and therefore may be used for measuring the temperature over a wide range. Alternatively, the diode may be driven in reverse direction by applying a reverse voltage. In this case, the reverse current may be measured. The reverse current varies in an exponential manner with temperature. Accordingly, measuring the reverse current may be used for detecting a distinct threshold temperature (high temperature) and thus may be used in combination with a protection circuit which turns off the transistor when the temperature exceeds the threshold voltage.

Figure 2B:
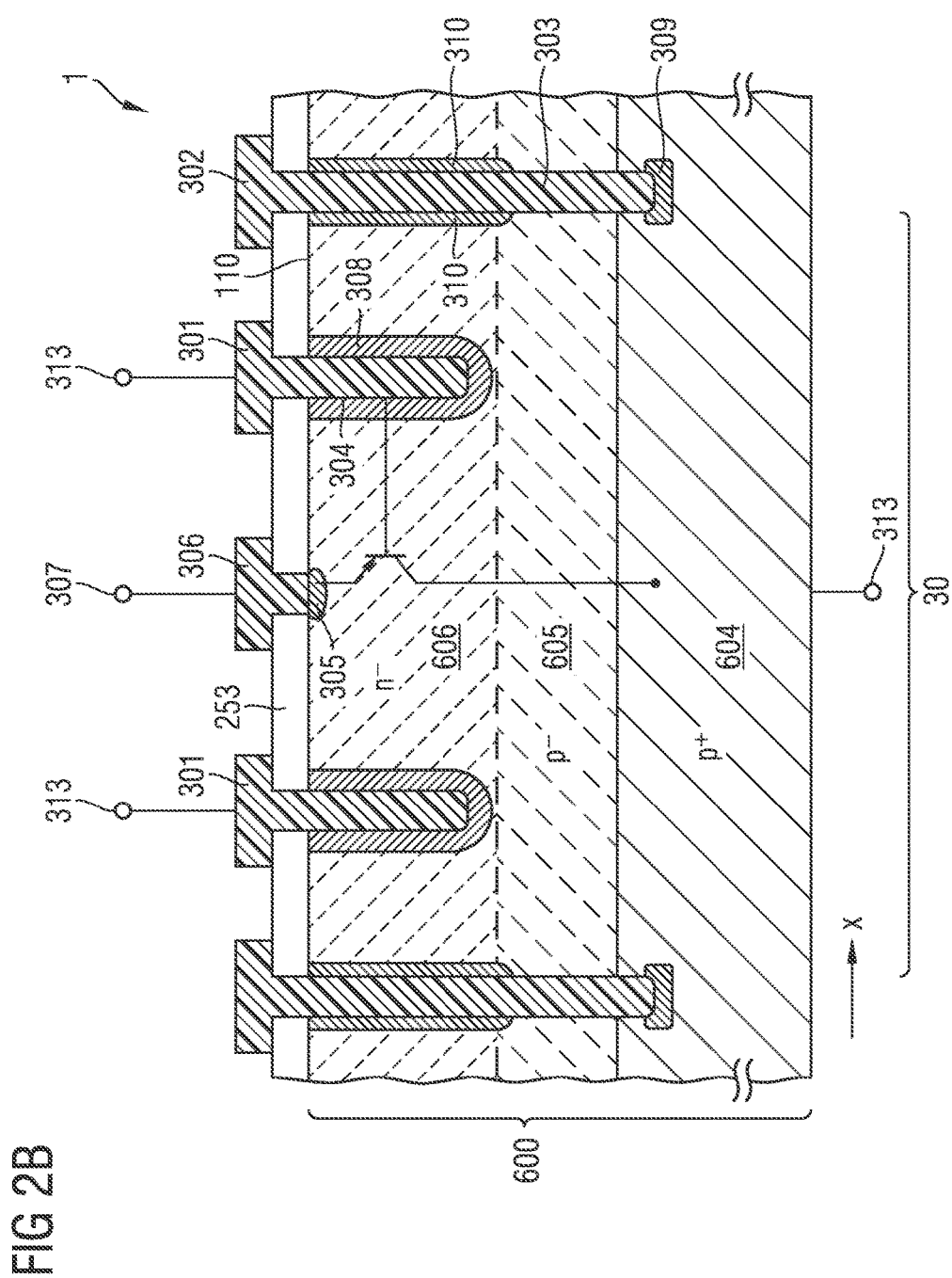
FIG. 2B shows a cross-sectional view of a temperature sensor according to a further embodiment.

FIGS. 2A and 2B show examples of semiconductor devices 1 comprising a temperature sensor 30 comprising contact structures for contacting the pn junction. The specific manner of detecting the temperature by measuring the reverse current or the forward voltage may be implemented by connecting the terminals illustrated in FIGS. 2A and 2B with terminals of respective measurement devices. FIG. 2A shows a semiconductor device 1 comprising a temperature sensor 30. The temperature sensor 30 is formed in a semiconductor body 600 comprising a first region 606 of a first conductivity type and a first portion 604 of a second conductivity type. The first region 606 is disposed over the first portion 604. For example, the semiconductor body 600 may be a semiconductor substrate. As is to be readily understood, the semiconductor body 600 may comprise non-single crystalline, e.g. polycrystalline semiconductor portions.

The temperature sensor 30 comprises a first contact 301 in contact with the first region 606 and a second contact 302 in contact with the first portion 604. The second contact 302 is disposed in a second sensor contact groove 303 in the first main surface 610 and extends to the first portion 604.

For example, the second sensor contact groove 303 may not extend to a second main surface 620 of the semiconductor body 600. For example, the second sensor contact may be electrically connected via the first portion 604 to the second main surface 620 of the semiconductor body 600.

According to an embodiment, the first region 606 may contact the first portion 604 to form a pn junction. According to a further embodiment, the semiconductor body may further comprise a second portion 605 of the second conductivity type, the second portion 605 being sandwiched between the first region 606 and the first portion 604. Accordingly, the pn junction may be formed between the first region 606 and the second portion 605.

In all embodiments described herein, the second sensor contact trench 303 may further be disposed before and behind the depicted plane of the drawing and may extend in the first direction, e.g. the x direction. In particular, the second sensor contact groove 303 may completely enclose the temperature sensor 30.

Generally, when the diode is driven in a forward direction, minority carriers may be generated which may leak to the transistor cells. Accordingly, it is desirable to provide an effective insulation between the temperature sensor 30 and the transistor cells. According to the embodiments described herein, the second sensor contact groove 303 extending into the first portion 104, 604 of the second conductivity type prevents minority carriers from leaking to neighboring transistor cells. As a result, the temperature sensor 30 is effectively insulated from the transistor cells surrounding. Further, since a conductive material 115 such as polysilicon or tungsten is filled into the second sensor contact trenches 303, heat may be transferred effectively from the transistor 100 to the temperature sensor 30 so that the temperature of the semiconductor device may be measured.

As is further illustrated in FIG. 2A, a doped sidewall portion 310 of the second conductivity type insulates the conductive material 115 of the second sensor contact trench 303 from the first region 606 of the semiconductor body 600.

FIG. 2B shows a further embodiment of semiconductor device 1 comprising a temperature sensor 30. In addition to the components discussed with reference to FIG. 2A, the temperature sensor 30 further comprises an emitter region 305 of the second conductivity type. The temperature sensor 30 further comprises a emitter contact 306 which is electrically connected to the emitter region 305. The emitter region 305 may be implemented as a shallow implanted portion disposed adjacent to the first main surface 110 of the semiconductor substrate. The first contact 301 (basis) and the second contact 302 (collector) may be electrically connected to a common terminal 313. The emitter contact may be connected to an emitter terminal 307.

Figure 2C:
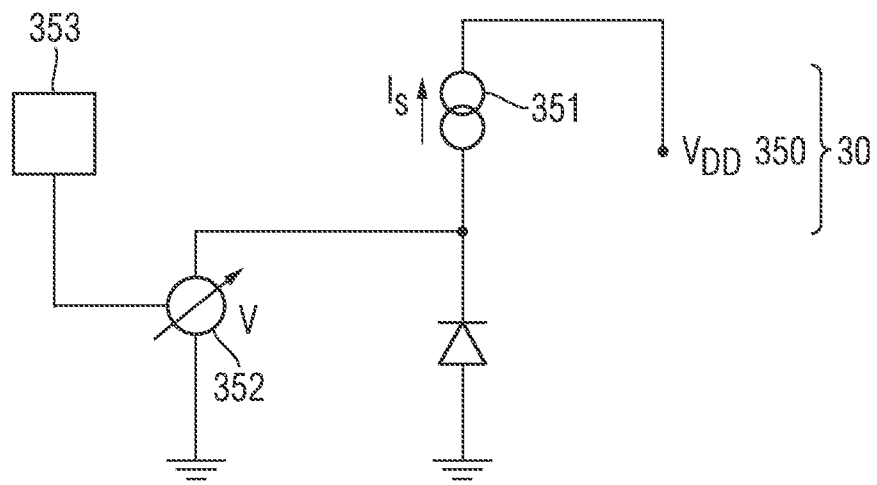
FIGS. 2C and 2D are equivalent circuit diagrams of the temperature sensors shown in FIGS. 2A and 2B, respectively.

FIG. 2C shows an equivalent circuit diagram of the temperature sensor 30 described with reference to FIG. 2A. According to the embodiment of FIG. 2C, the temperature sensor comprises a pn junction or diode. One terminal of the diode is electrically connected to a ground terminal. A constant current is impressed to the diode. The constant current is generated by a voltage source 350 connected to a converting element 351 such as a resistor or a transistor. The polarity of the generated current is set so that the diode is driven in forward direction. A voltage is measured by the voltage measurement device 352 that is connected in parallel with the diode. A signal generated by the voltage measurement device 352 is fed to the control element 353 that determines the temperature from the voltage signal. When the pn junction or diode is driven in reverse direction to measure the leakage current, a current measurement device is connected in series with the pn junction or diode, while a constant reverse voltage is applied, and the measured current signal is fed to the control element 353.

Figure 2D:
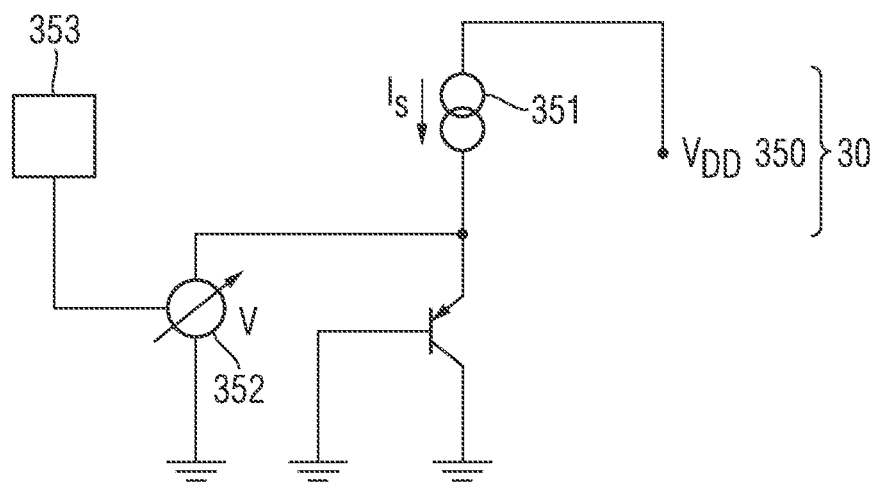

FIG. 2D shows an equivalent circuit diagram of the temperature sensor 30 described with reference to FIG. 2B. According to the embodiment of FIG. 2D, the temperature sensor comprises a bipolar transistor in which base and collector are connected to a common terminal, e.g. the ground terminal. For example, when a positive voltage is applied to the emitter, the diode threshold between emitter and basis may be determined, for example, by impressing a constant current. The constant current may be generated by a voltage source 350 connected to a converting element 351 such as a resistor or a transistor. The polarity of the generated current is set so that the resulting diode is driven in forward direction. A voltage is measured by the voltage measurement device 352 that is connected in parallel with the bipolar transistor. A signal generated by the voltage measurement device 352 is fed to the control element 353 that determines the temperature from the voltage signal. When the resulting diode is driven in reverse direction to measure the leakage current, a current measurement device is connected in series with the bipolar transistor, while a constant reverse voltage is applied, and the measured current signal is fed to the control element 353.

The measurement methods described with reference to FIGS. 2A to 2D may be used for the semiconductor devices illustrated in FIGS. 1A to 1E.

When using the diode-based temperature sensor 30 that is, e.g. shown in FIGS. 1A, 1C, and 1E and in FIGS. 2A and 2C, a terminal 311 connected to the first contact 301 of the temperature sensor 30 is held at a lower potential than a terminal 271 connected to the second contact 302. Accordingly, as is shown in FIG. 2C, when the terminal connected to the second contact 302 is held at Ground, a negative voltage is applied to the terminal 311 connected to the first contact 301.

When using the bipolar transistor-based temperature sensor 30, that is, e.g. shown in FIGS. 1B, 1D and in FIGS. 2B and 2D, a terminal 307 connected to the emitter contact 306 of the temperature sensor 30 is held at a higher potential than a terminal 271 connected to the second contact 302. Accordingly, as is shown in FIG. 2C, when the terminal connected to the second contact 302 is held at Ground, a positive voltage is applied to the terminal 307 connected to the emitter contact 306.

Figure 3A:
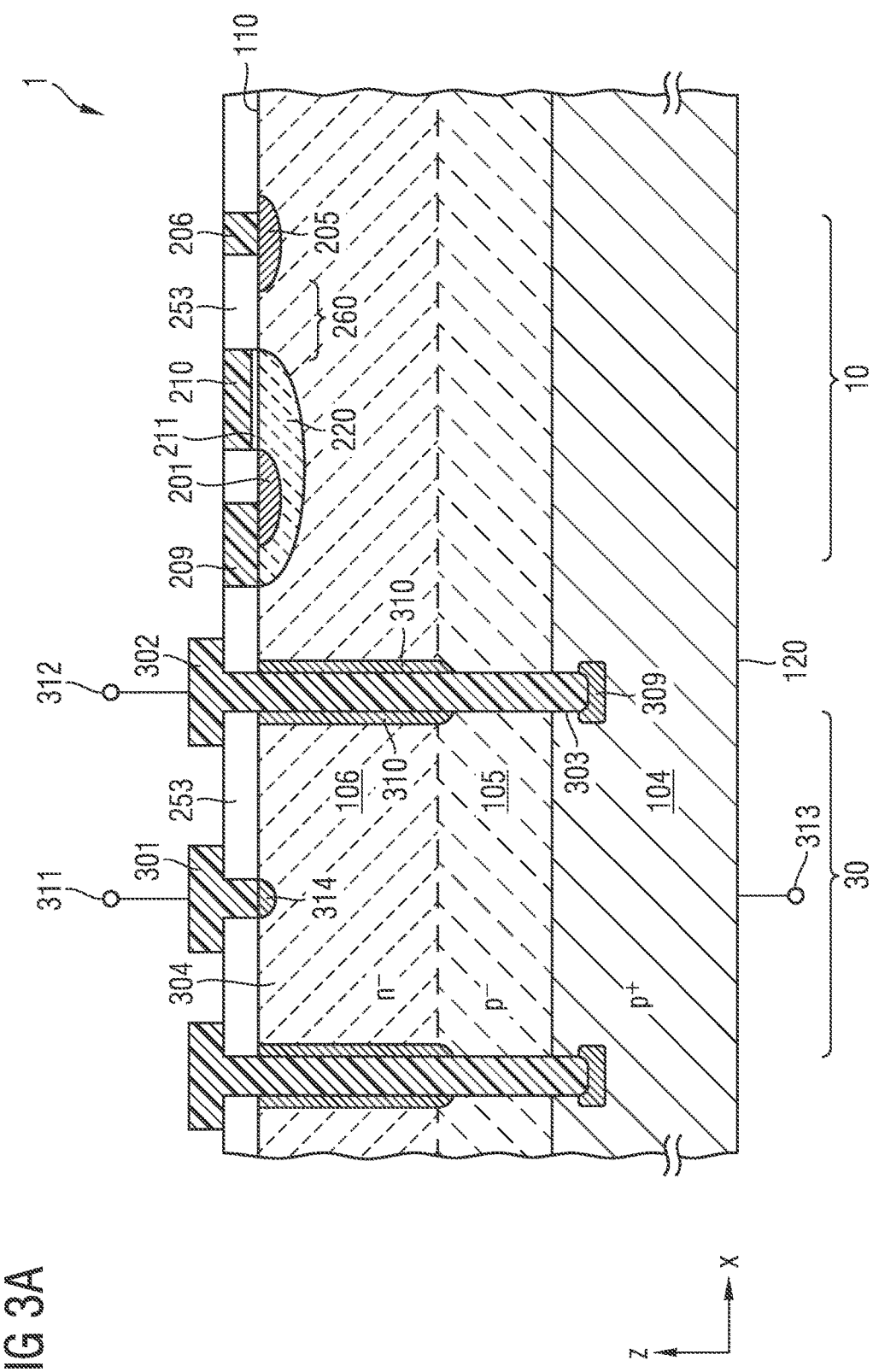

FIG. 3A shows a cross-sectional view of a semiconductor device 1 according to further embodiment. The semiconductor device 1 comprises the temperature sensor 30 which has been explained before with reference to FIGS. 2A and 2B and further a transistor 10 which may be implemented in a manner that is different from the embodiment shown in FIGS. 1A to 1E. For example, the transistor may be implemented by a planar transistor. The transistor may comprise a source region 201, a drain region 205, a body region 220 and drift zone 260. The body region 220 and the drift zone 260 are arranged along a first direction, e.g. the x direction parallel to the first main surface 110 of the semiconductor substrate 100. The source region 201 and the drain region 205 are formed adjacent to the first main surface 110. The gate electrode 210 controls a conductivity of a channel formed in the body region 220. The gate electrode 210 may be insulated from the body region 220 by means of a gate dielectric 211. The gate electrode 210 may be entirely disposed over the first main surface 110 of the semiconductor substrate without any portions extending in the main surface 110. Hence, the source region 201 and the drain region may not extend into the depth direction (e.g. the z direction) of the semiconductor substrate. The source contact 209 may be disposed over the first main surface 110 and may not extend into the semiconductor substrate 100. Likewise the drain contact 206 may be disposed over the first main surface 110 of the semiconductor substrate 100 and may not extend into the semiconductor substrate.

The temperature sensor 30 comprises a first sensor contact 301 and a second sensor contact 302. The second sensor contact 302 may be disposed in a second sensor contact trench 303 that extends to the first portion 104 of the second conductivity type. The first sensor contact 301 may comprise a doped portion 314 adjacent to the first main surface 110 of the semiconductor substrate. According to further embodiments, the first sensor contact 301 may be implemented in a different manner, e.g. in the manner that has been explained with reference to FIGS. 1A to 1E comprising a first sensor contact groove 304. However, as is shown in FIG. 3A, such a first sensor contact groove 304 may be dispensed with and the first sensor contact 301 may be entirely disposed over the first main surface 110 of the semiconductor substrate and may contact the first region 106 via the doped portion 314. For example, the doped portion 314 in contact with the first sensor contact 301 may be formed simultaneously with forming the source region 201 and the drain region 205.

In a similar manner as has been discussed above, the semiconductor substrate 100 may comprise a first portion 104 of the second conductivity type and a first region 106 of the first conductivity type. The first portion 104 may contact the first region 106. According to a further embodiment, a second portion 105 of the second conductivity type may be sandwiched between the first portion 104 and the first region 106. The further components of the semiconductor device shown in FIG. 3A are similar to those illustrated with reference to FIGS. 1A to 1E so that a detailed description thereof will be omitted.

FIG. 3B shows a semiconductor device according to still a further embodiment. The semiconductor device of FIG. 3B comprises a transistor 10 and a temperature sensor 30. The transistor 10 may be implemented in the manner as has been discussed with reference to FIG. 3A. Further, the temperature sensor 30 may be implemented in the manner as has been explained with reference to FIG. 2B.

In particular, the temperature sensor 30 may comprise a first sensor contact 301, a second sensor contact 302 and an emitter region 305 which is in contact with an emitter contact 306. The first sensor contact 301 (basis) and the second sensor contact 302 (collector) may be connected to a common terminal 313. The emitter contact 306 may be connected to an emitter terminal 307. The first sensor contact 301 may be connected to the first region 106 via a doped portion 314. Due to the fact that the source region 201 and the drain region 205 of the transistor 10 are implemented as shallow implanted portions and the source contact 209 and the drain contact 206 are disposed above the first main surface 110 of the semiconductor substrate 100, a trench may not be formed in the semiconductor substrate 100. Hence, the first sensor contact 301 may be formed over the first main surface 110 so as to further simplify the manufacturing process. For example, the doped portion 314 in contact with the first sensor contact 301 may be formed simultaneously with forming the source region 201 and the drain region 205 of the transistor.

Further components and characteristics of the transistor 10 shown in FIGS. 1A to 1E will be explained below in more detail with reference to FIGS. 4A to 4D. FIG. 4A shows a cross-sectional view of a portion of a semiconductor device according to an embodiment. The cross-sectional view of FIG. 4A is taken between II and II', as is also illustrated in FIG. 4B. The semiconductor device 1 shown in FIG. 4A comprises a transistor 10 in a semiconductor substrate 100 having a first main surface 110. The transistor 10 comprises a source region 201, a source contact electrically connected to the source region 201, a drain region 205, a body region 220, a drift zone 260 and a gate electrode 210. The gate electrode 210 is disposed in a gate trench 212 (indicated by broken lines) in a plane before and behind the drawing plane. The gate electrode 210 is configured to control a conductivity of a channel in the body region 220. A longitudinal axis of the gate trench 212 extends in a first direction parallel to the first main surface 110, e.g. the x-direction. The body region 220 and the drift zone 260 are disposed along the first direction between the source region 201 and the drain region 205. The source contact comprises a first contact portion 202 and a second source contact portion 130. The second source contact portion 130 is disposed at a second main surface 120 of the semiconductor substrate 100, opposite to the first main surface 110. For example, the second source contact portion 130 may implement a source contact layer which may be a source or back side metallization layer. The first source contact portion 202 comprises a source conductive material 115 in direct contact with the source region 201 and a portion 104 of the semiconductor substrate 100 arranged between the source conductive material 115 and the second source contact portion 130.

For example, the source conductive material 115 may comprise several elements that are electrically connected. The term "arranged between" is intended to mean that the portion of the semiconductor substrate is lying at an intervening position between the source conductive material 115 and the second source contact portion. Further elements may be disposed between the second source contact portion and the portion of the semiconductor substrate or between the portion of the semiconductor substrate and the first source contact portion. This term may further comprise the meaning that at least two of the source conductive material, the portion 104 of the semiconductor substrate 100 and the second source contact portion 130 may horizontally overlap. In more detail, there may be at least one horizontal region in which the portion 104 of the semiconductor substrate 100 and the second source contact portion 130 are stacked one over the other so that they horizontally overlap. Further or alternatively, there may be at least one horizontal region in which the portion 104 of the semiconductor substrate 100 and the source conductive material 115 are stacked one over the other so that they horizontally overlap. The source conductive material 115 may horizontally overlap with the second source contact portion 130. According to a further embodiment, the source conductive material 115 does not horizontally overlap with the second source contact portion 130.

The source conductive material 115 may extend in the semiconductor substrate 100 to a depth larger than a depth of the gate trench 212. In the embodiment illustrated in FIG. 4A, the semiconductor substrate 100 comprises a first portion 104 on a side of the back side or the second main surface 120 of the substrate. The first portion 104 may comprise a heavily doped portion of the second conductivity type, e.g. p+. The first portion 104 forms a planar layer. A doping concentration of the first portion 104 may vary from a side at the second main surface 120 to a side remote from the second main surface 120. A layer 105 of the second conductivity type at a lower doping concentration is layered over the first portion 104. The layer 105 may form a second portion.

The drift zone 260 which may be of the first conductivity type may be formed in direct contact with the second portion 105 of the second conductivity type. For example, the drift zone 260 may be disposed in a first region 106 of the first conductivity type. The first region 106 may be epitaxially formed over the second portion 105 of the second conductivity type. According to a further example, the first region 106 having the first conductivity type may be defined by doping using an ion implantation process. Further, the body region 220 is disposed over the second portion 105. The body region 220 may be doped with the second conductivity type. The source region 201 may be of the first conductivity type and is disposed so as to extend into the semiconductor substrate 100. For example, the source region 201 may form a part of a sidewall 114 of a source contact groove 112 in the semiconductor substrate 100. The source region 201 and the drain region 205 may be formed adjacent to the first main surface 110 of the semiconductor substrate 100.

The source contact groove 112 may be formed in the semiconductor substrate 100 from the first main surface 110 so as to extend into the depth direction, e.g. the z direction of the substrate 100. The depth of the source contact groove 112 may be larger than a depth of the gate trench 212. The depth of the source contact groove may be approximately 3 to 20 μm, e.g. 4 μm. For example, the source contact groove 112 may extend to the first portion 104 of the semiconductor substrate, the first portion 104 having the higher doping concentration. A doped portion 113 of the second conductivity type at a higher doping concentration than the doping concentration of the first substrate portion 104 may be disposed beneath the source contact groove 112. The heavily doped portion 113 may implement a contact portion. According to a further embodiment, the source contact groove may extend to the second portion 105 of the substrate and may not extend to the first portion 104. The electrical contact to the first portion 104 may be implemented by the contact portion 113 arranged between the source contact groove 112 and the first portion 104. An insulating material 253 may be formed over the first main surface 110 of the semiconductor substrate so that the source contact 202 may be disconnected from the top surface of the semiconductor device.

According to the example shown in FIG. 4A, the source region 201 is electrically connected to a source contact layer or second source contact portion 130 disposed on the second main surface 120 of the semiconductor substrate 100 by means of the first source contact portion 202 that comprises a source conductive material 115 in the source contact groove and the first portion 104 of the semiconductor substrate. As a result, the source contact implements a vertical contact to the back side of the semiconductor device 1 by means of a low resistive source conductive material 115 which is filled in the source contact groove 112. The source conductive material 115 may comprise a metal such as tungsten. The second source contact portion 130 may be electrically connected to a source terminal 271.

Due to the feature that the source conductive material 115 deeply extends into the semiconductor substrate, e.g. to the first portion 104 of the semiconductor substrate, a parasitic bipolar transistor may be deteriorated or suppressed. In more detail, the heavily doped portion 104 suppresses a transistor, e.g. the npn transistor which could otherwise be formed in this region. This effect may also be achieved when the source conductive material 115 extends into the second portion 105 of the semiconductor substrate, and the contact portion 113 is disposed between the source conductive material 115 and the first portion 104. Due to the presence of the source conductive material 115 deeply extending into the semiconductor substrate 100, e.g. to the first portion 104 or to the second portion 105, arrangements of adjacent transistors cells may be insulated.

Generally, power transistors comprise a plurality of basic transistor cells in the manner as is described herein with reference to the figures shown. The single transistor cells may be connected parallel to each other and share common source, drain, and gate terminals. Further, depending on the specific implementation, the single transistor cells of the transistors may share common source and drain regions. For example, a plurality of parallel transistor cells may be arranged along a second direction, e.g. the y-direction, and may be connected in parallel to form a transistor. Further transistor cells of the transistor may be disposed in a mirrored manner with respect to the drain region. In the context of the present specification, the term "semiconductor device" may refer to the transistor cell or may refer to a transistor 10 comprising a plurality of transistor cells.

The drain contact 206 is disposed in a drain contact groove 204 in the semiconductor substrate. A depth of the drain contact groove may be approximately 0.2 to 20 μm, e.g. 1.0 μm. The drain region 205 which may be of the first conductivity type is electrically connected to the drain contact 206. The drain contact 206 extends to the top side of the semiconductor device. A drain contact layer 140, e.g. a drain metallization layer is disposed on the top side of the semiconductor device. The drain contact layer 140 may be electrically connected to a drain terminal 272.

Examples of the source conductive material 115 and the material of the drain contact, e.g. a drain conductive material comprise metals such as tungsten and polysilicon. Examples of the materials of the second source contact portion 130 and the drain contact layer 140 comprise metals such as tungsten. As is to be readily appreciated, these materials are merely given as examples and further materials may be used.

The semiconductor device 10 may further comprise a field plate 250. According to an embodiment, the field plate 250 may be implemented as a planar field plate that is disposed over the first main surface 110 of the semiconductor substrate. According to a further embodiment, the field plate may be arranged in a field plate trench 252 that extends in the semiconductor substrate. The field plate 250 may be insulated from the drift zone 260 by means of a field dielectric layer 251. The gate electrode 210 is insulated from the body region 220 by means of the gate dielectric layer 211.

FIG. 4A further shows a horizontal body contact portion 225b of the second conductivity type that may be disposed below the body region 220. The horizontal body contact portion 225b is electrically connected with the source region.

A vertical body contact portion 225a is formed adjacent or in the second portion 114b of the sidewall of the source contact groove 112 in a plane before or behind the plane of the drawing of FIG. 4A. Accordingly, the vertical body contact portion 225a vertically overlaps with the source region 201. The wording "vertically overlaps with" is intended to mean that the respective portions or regions may extend in the same depth. In more detail, there may be a vertical extension of the semiconductor body at which the respective portions or regions may be present. To be more specific, the starting points of the respective portions or regions do not need to coincide. Further, the end points of the respective portions or regions do not need to coincide. The vertical body contact portion 225a is electrically connected to the source contact 202.

Due to the presence of the vertical and the horizontal body contact portions 225a, 225b and, in particular due to the feature that the vertical body contact portion 225a vertically overlaps with the source region 201, the suppression of a parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated.

FIG. 4B shows a horizontal cross-sectional view of the semiconductor device illustrated in FIG. 4A. As is shown, the semiconductor device 1 comprises a source contact groove 112 and a drain contact groove 204. The source contact groove 112 and the drain contact groove 204 extend in a second direction (e.g. the y direction) which is perpendicular to the first direction. The source contact groove 112 and/or the drain contact groove 204 need not have strictly vertical sidewalls. In more detail, the sidewalls may also be inclined or rounded. For example, the source contact groove 112 and/or the drain contact groove 204 may be tapered. The semiconductor device further comprises gate trenches 212 that are formed in the first main surface 110 of the semiconductor device and field plate trenches 252. A longitudinal axis of the gate trenches 212 and the field plate trenches 252 may extend in the first direction. The term "longitudinal axis" refers to a horizontal axis along which the respective trench has a greater extension length than in another horizontal direction. The gate trenches 212 pattern the body region 220 into a plurality of segments, e.g. ridges or fins.

The sidewall 114 of the source contact groove 112 may be segmented into first portions 114a and second portions 114b. The source region 201 may be disposed adjacent to or in first portions 114a of the sidewall. Further, the vertical body contact portion 225a may be disposed adjacent to or in second portions 114b of the sidewall 114. The distance between adjacent gate trenches 212 may be different from a distance between adjacent field plate trenches 252. A portion of the gate electrode 210 may be disposed over the first main surface 110 of the semiconductor substrate and may extend in the second direction. Further, a portion of the field plate 250 may be disposed over the first main surface 110 of the semiconductor substrate and may extend in the second direction.

Figure 4C:
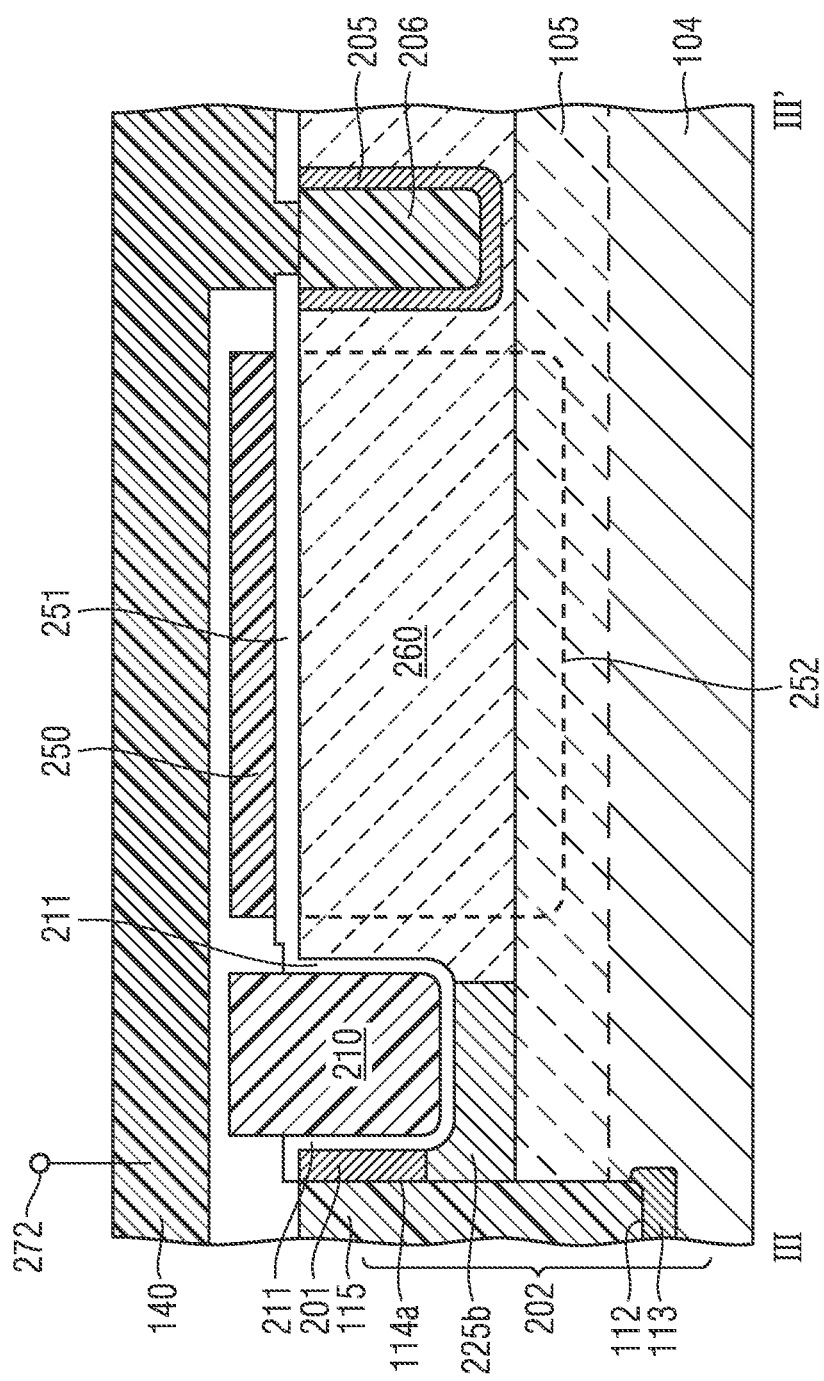

FIG. 4C shows a cross-sectional view of the semiconductor device shown in FIGS. 4A and 4B, the cross-sectional view being taken at a position so as to intersect the gate trenches 212. The cross-sectional view of FIG. 4C is taken between III and III', as is also illustrated in FIG. 4B. The cross-sectional view of FIG. 4C shows the same components as FIGS. 4A and 4B. Further, the gate trench 212 extends in the semiconductor substrate 110 in the depth direction. FIG. 4C further shows modifications of the embodiment illustrated in FIGS. 4A and 4B. Differing from the structures shown in FIGS. 4A and 4B, the field plate trench 252 (indicated by broken lines and being disposed before and behind the depicted plane of the drawing) may extend to the second portion 105 of the semiconductor substrate. For example, the field plate trench 252 may extend to a depth that is deeper than the depth of the drift zone 260. As a result, the field plate 250 may vertically overlap with the second portion 105 of the semiconductor substrate having the second conductivity type.

According to a further modification, that may be independent from the depth of the field plate trench 252, the drain contact groove 204 may extend to the second portion 105 of the semiconductor substrate. As a result, the drain contact 206 may vertically overlap with the second portion 105 of the semiconductor substrate having the second conductivity type. For example, the semiconductor portion 105 of the second conductivity type may be disposed adjacent to the drain contact 206.

Figure 4D:
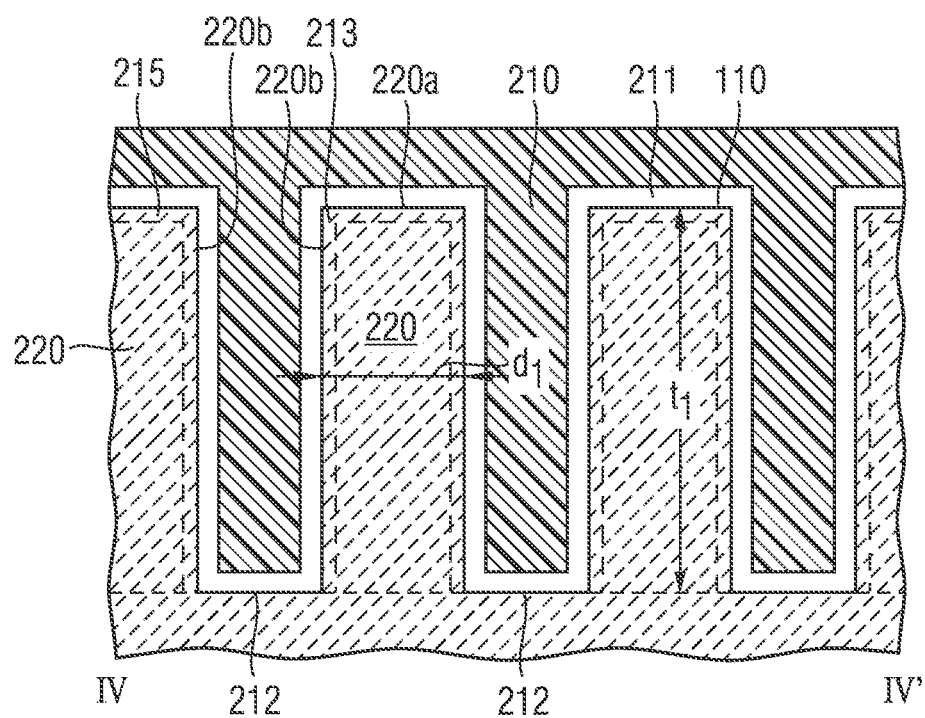

FIG. 4D shows a cross-sectional view which is taken along the second direction, e.g. the y-direction. The cross-sectional view of FIG. 4D is taken between IV and IV' as is illustrated in FIG. 4B so as to intersect a plurality of gate trenches 212. Portions of semiconductor material 220 forming the single ridges or fins may be patterned by adjacent gate trenches 212. The ridges comprise a top surface 220a and sidewalls 220b. A gate dielectric layer 211 is disposed adjacent to the sidewalls 220b and the top surface 220a of each of the ridges. A conductive material is filled in the trenches 212 between adjacent ridges to form the gate electrode 210. As a result, the body region 220 has the shape of a ridge extending in the first direction. Differently stated, a longitudinal axis of the ridges or the fins corresponds to the first direction.

The sidewalls 220b may extend perpendicularly or at an angle of more than 75° with respect to the first main surface 110. The gate electrode 210 may be disposed adjacent to at least two sides of the ridge.

When the transistor is switched on, e.g. by applying as suitable voltage to the gate electrode 210, a conductive inversion layer 213 (conductive channel) is formed at the boundary between the body region 220 and the gate dielectric layer 211. Accordingly, the field effect transistor is in a conducting state from the source region 201 to the drain region 205. In case of switching off, no conductive inversion layer is formed and the transistor is in a non-conducting state. According to an embodiment, the conductive channel regions 213 formed at opposing sidewalls 220b of a ridge do not merge with each other so that the body region 220 may not be fully depleted and may be connected to the source region and to the body contact region 225.

For example, a distance between adjacent gate trenches 212 that corresponds to a width d1 of the ridges may be larger than 200 nm, e.g. 200 to 2000 nm, for example, 400 to 600 nm. The transistor may further comprise a field plate. When the transistor is switched off, e.g. by applying a corresponding voltage to the gate electrode, carriers may be depleted from the drift zone. As a result, a doping concentration of the drift zone may be increased while maintaining the blocking capability of the transistor. As a result, the on-state resistance may be further reduced, while securing the high voltage blocking capability.

According to a further embodiment, the width d1 of the body region 220 fulfills the following relationship: $d1 \leq 2*l_d$, wherein $l_d$ denotes a length of a depletion zone which is formed at the interface between the gate dielectric layer 211 and the body region 220. For example, the width of the depletion zone may be determined in Equation 1 as:

$$l_d = \sqrt{\frac{4\varepsilon_s kT \ln(N_A/n_i)}{q^2 N_A}}$$ Equation 1 wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature (e.g. 300 K), ln the denotes the natural logarithm, NA denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

According to the embodiment in which the width d1≤2*ld, the transistor is a so-called "fully-depleted" transistor in which the body region 220 is fully depleted when the gate electrode 210 is set to an on-voltage. In such a transistor, an optimal sub-threshold voltage may be achieved and short channel effects may be efficiently suppressed, resulting in improved device characteristics.

In the field effect transistor 10 illustrated in FIGS. 4A to 4D the gate electrode 210 is disposed in a gate trench 212 in the first main surface 110, the source region 201 vertically extends into the semiconductor substrate 100, and the drain region 205 vertically extends in the semiconductor substrate 100. As a result, the effective channel width and the volume of the drain extension of the transistor cell may be largely increased, thereby reducing the on-state resistance. Due to the fact that the source contact 202 comprises a portion 104 of the semiconductor substrate 100 and the source conductive material 115 in direct contact with the source region 201 and extends in the semiconductor substrate to a depth larger than a depth of the gate trench, a vertical semiconductor device may be implemented. The semiconductor device may further comprise a temperature sensor 30 which may be formed in the same semiconductor substrate 100 as the transistor. In particular, components of the temperature sensor 30 such as the first and second sensor contacts 301, 302 may be formed by the same processes as the components of the source and drain contact of the transistor. Thereby, the manufacturing process may be further simplified. Due to the presence of the body contact portion 225, the safe-operating area of the transistor may be further improved.

The semiconductor device 1 illustrated with reference to FIGS. 4A to 4D comprises a transistor 10 including a plurality of single transistor cells which may be connected in parallel. The pattern of the single transistor cells may be repeated and mirrored along the first and the second directions. As is specifically illustrated in FIG. 4A, parallel transistor cells may be connected to a second source contact portion 130 (e.g. a common back side metallization layer) which is formed adjacent to the second main surface of the semiconductor substrate 100. Moreover, several transistors each comprising a plurality of transistor cells may be connected to a second source contact portion 130 (e.g. the common back side metallization layer) which is formed adjacent to the second main surface of the semiconductor substrate 100. Further, the drain portions of adjacent transistor cells may be connected to a common drain contact layer 140 that is disposed on a side of the first main surface 110 of the semiconductor substrate 100. Accordingly, no specific patterning of the metallization layer is necessary for contacting transistor cells of the single transistors. As a result, the manufacturing process may be further simplified and cost may be reduced. The gate electrode 210 may be electrically connected from a side of the semiconductor device 10. The field plate 250 may be, e.g. connected to the source terminal 271.

Figure 5:
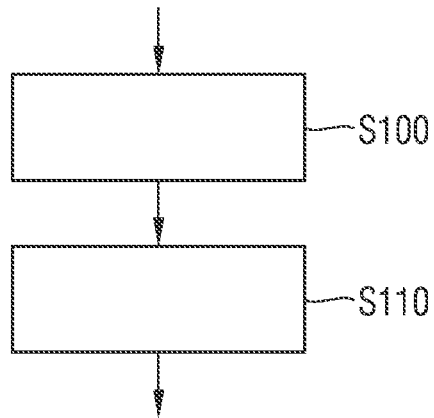
FIG. 5 schematically illustrates a method according to an embodiment.

FIG. 5 summarizes a method according to an embodiment. The method refers to manufacturing a semiconductor device comprising a temperature sensor in a semiconductor body, the semiconductor body comprising a first region of a first conductivity type and a first portion of a second conductivity type, the first region being disposed over the first portion. The method comprises forming (S100) a first contact in contact with the first region, and forming (S110) a second contact in contact with the first portion. The second contact is disposed in a second sensor contact groove in a first main surface and extending to the first portion. Forming the first contact may be accomplished before forming the second contact. Alternatively, forming the first contact may be accomplished after or simultaneously with forming the second contact.

Figure 6:
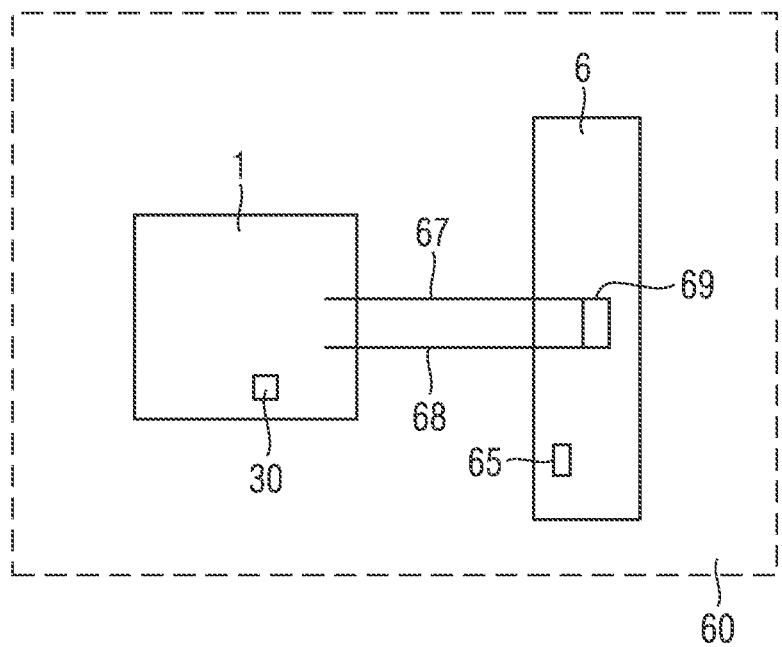
FIG. 6 schematically illustrates an electric circuit according to an embodiment.

FIG. 6 shows a schematic diagram of an electric device 600 according to an embodiment. The electric device 600 may comprise the semiconductor device 1 as has been described above and further circuitry 6. For example, the electric device 600 may implement a switching device, e.g. a protected switch. The further circuitry 6 may be electrically connected with the semiconductor device 1 by means of connection lines 67, 68. For example, signals may be transmitted from the semiconductor device 1 to the further circuitry 6 and vice versa. As has been explained above, the semiconductor device 1 comprises a temperature sensor 30. A current or voltage signal measured by the temperature sensor 30 may be transmitted to the circuitry 6 via one of the connection lines. The further circuitry 6 may comprise a further sensor 65 and a control element 69, e.g. a control circuit. For example, the control element 69 may receive a current or voltage signal transmitted form the temperature sensor and may turn off the semiconductor device 1 when the measured temperature exceeds a predetermined threshold. The circuitry 6 may comprise further components, e.g. for providing an overvoltage protection or further protection. For providing this protection measurement signals of the further sensor 65 may be used. The semiconductor device 1 and the circuitry 600 may be integrated into one chip or may be formed as separate components. The electric device 600 implementing a switching device may, e.g. used as a high side switch or as a low side switch, e.g. in a bridge circuit.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor in a semiconductor substrate having a first main surface, the transistor comprising:
    a source region;

a source contact electrically connected to the source region, the source contact comprising a first source contact portion and a second source contact portion; and a gate electrode in a gate trench in the first main surface adjacent to a body region, the gate electrode being configured to control a conductivity of a channel in the body region, the body region and a drift zone are disposed along a first direction parallel to the first main surface between the source region and a drain region, the second source contact portion is disposed at a second main surface of the semiconductor substrate, and the first source contact portion comprises a source conductive material in direct contact with the source region, the first source contact portion further comprises a portion of the semiconductor substrate between the source conductive material and the second source contact portion, and wherein the semiconductor device further comprises a temperature sensor in the semiconductor substrate.

2. The semiconductor device according to claim 1, wherein the semiconductor substrate comprises a first region of a first conductivity type and a first portion of a second conductivity type, a part of the first portion being a component of the first source contact portion, and the temperature sensor comprises a first contact in contact with the first region, and a second contact in contact with the first portion.

3. The semiconductor device according to claim 2, wherein the source conductive material is disposed in a source contact groove in the first main surface, the source contact groove extending to the first portion, and the second contact is disposed in a second sensor contact groove in the first main surface and extends to the first portion.

4. The semiconductor device according to claim 3, wherein the source contact groove and the second sensor contact groove extend to a same depth.

5. The semiconductor device according to claim 3, wherein the second sensor contact groove does not extend to the second main surface of the semiconductor substrate.

6. The semiconductor device according to claim 2, wherein the first contact is disposed in a first sensor contact groove in the first main surface.

7. The semiconductor device according to claim 2, wherein the temperature sensor further comprises an emitter region of the second conductivity type in contact with the first region.

8. The semiconductor device according to claim 7, wherein the first and the second contact of the temperature sensor are connected to a common terminal.

9. A semiconductor device comprising:

a temperature sensor in a semiconductor body comprising a first region of a first conductivity type and a first portion of a second conductivity type, the first region being disposed over the first portion;

the temperature sensor comprising a first contact in contact with the first region, and a second contact in contact with the first portion; and the second contact being disposed in a second sensor contact groove in a first main surface of the semiconductor body and extending to the first portion.

10. The semiconductor device according to claim 9, wherein the second sensor contact groove does not extend to a second main surface of the semiconductor body.

11. The semiconductor device according to claim 9, further comprising an emitter region of the second conductivity type in contact with the first region.

12. The semiconductor device according to claim 11, wherein the first and the second contact of the temperature sensor are connected to a common terminal.

13. The semiconductor device according to claim 9, further comprising a transistor formed in the semiconductor device, the transistor comprising a source region and a drain region arranged along a first direction parallel to the first main surface.

14. The semiconductor device according to claim 13, wherein the transistor further comprises a gate electrode entirely disposed over the first main surface.

15. The semiconductor device according to claim 14, further comprising a source contact including a first source contact portion and a second source contact portion disposed at a second main surface opposite the first main surface.

16. The semiconductor device according to claim 14, further comprising a drain contact including a first drain contact portion and a second drain contact portion disposed at a second main surface opposite the first main surface.

17. An electric circuit comprising the semiconductor device according to claim 1.

18. The electric circuit according to claim 17, the electric circuit being a switching device.

* * * * *